United States Patent
Trunk et al.

(10) Patent No.: US 9,294,088 B2
(45) Date of Patent: Mar. 22, 2016

(54) INDUCTIVE DISTANCE SENSOR

(75) Inventors: Lothar Trunk, Weibersbrunn (DE);
Norbert Heitefuss, Frankfurt (DE);
Alan Lowell Houp, Frankfurt a. Main (DE)

(73) Assignee: DIEHL AEROSPACE GMBH, Ueberlingen (DE)

( * ) Notice: Subject to any disclaimer, the term of this patent is extended or adjusted under 35 U.S.C. 154(b) by 345 days.

(21) Appl. No.: 13/386,467

(22) PCT Filed: Aug. 12, 2010

(86) PCT No.: PCT/EP2010/004943
§ 371 (c)(1),
(2), (4) Date: Jan. 23, 2012

(87) PCT Pub. No.: WO2011/020580
PCT Pub. Date: Feb. 24, 2011

(65) Prior Publication Data
US 2012/0119728 A1 May 17, 2012

(30) Foreign Application Priority Data
Aug. 18, 2009 (DE) .......................... 10 2009 037 808

(51) Int. Cl.
*G01B 7/14* (2006.01)
*H01F 27/30* (2006.01)
*H03K 17/95* (2006.01)
*G01B 7/02* (2006.01)
(Continued)

(52) U.S. Cl.
CPC .............. *H03K 17/952* (2013.01); *G01B 7/023* (2013.01); *H01F 5/02* (2013.01); *H03K 17/9505* (2013.01); *H01F 27/325* (2013.01)

(58) Field of Classification Search
USPC ....................................... 324/207.15; 336/199
See application file for complete search history.

(56) References Cited

U.S. PATENT DOCUMENTS 4,700,167 A * 10/1987 Barankin et al. ............... 336/192
5,198,663 A * 3/1993 Ichikawa et al. ........... 250/231.1
5,506,560 A * 4/1996 Takeuchi et al. ................ 336/83
(Continued)

FOREIGN PATENT DOCUMENTS

DE 103 28 122 A1 1/2004
JP 1-84404 U 6/1989
(Continued)

OTHER PUBLICATIONS

Partial Translation of JP 11354339 A, Dec. 24, 1999.*
International Search Report dated Jun. 22, 2011 issued in PCT/EP2010/004943.
Japanese Office Action issued in Application No. 2012-525077 mailed Jul. 30, 2013, English translation only.

*Primary Examiner* — Bot Ledynh
(74) *Attorney, Agent, or Firm* — Scully, Scott, Murphy & Presser, P.C.

(57) ABSTRACT

Inductive adjustment of the core-fitted coil (16) of an eddy-current distance sensor (11) can be avoided if the coil (16) fills a physically predetermined annular space between the winding support (17) of the plastic coil former (15) and its flanges (18-19) as well as the wall (21) of a pot (20) composed of ferromagnetic material, which is placed over the rearward, smaller flange (18) and whose end face (21) rests against an annular area of the front, larger flange (19) with the same diameter as the pot (20). The ferromagnetic coil core (31) which engages coaxially in the winding support (17) can therefore be arranged on the base (24) in the pot (20) and can therefore be mounted as part of the pot (20).

18 Claims, 1 Drawing Sheet

(51) Int. Cl.
*H01F 5/02* (2006.01)
*H01F 27/32* (2006.01)

(56) References Cited

U.S. PATENT DOCUMENTS

2002/0190830 A1* 12/2002 Matsumoto et al. ............ 336/83

2005/0285707 A1* 12/2005 Furuya ........................ 336/208

FOREIGN PATENT DOCUMENTS

| JP | 1-152431 U | | 10/1989 |
| JP | 11354339 A | * | 12/1999 |
| WO | WO 2007/131373 A1 | | 11/2007 |
| WO | WO 2011/020580 A2 | | 2/2011 |

* cited by examiner

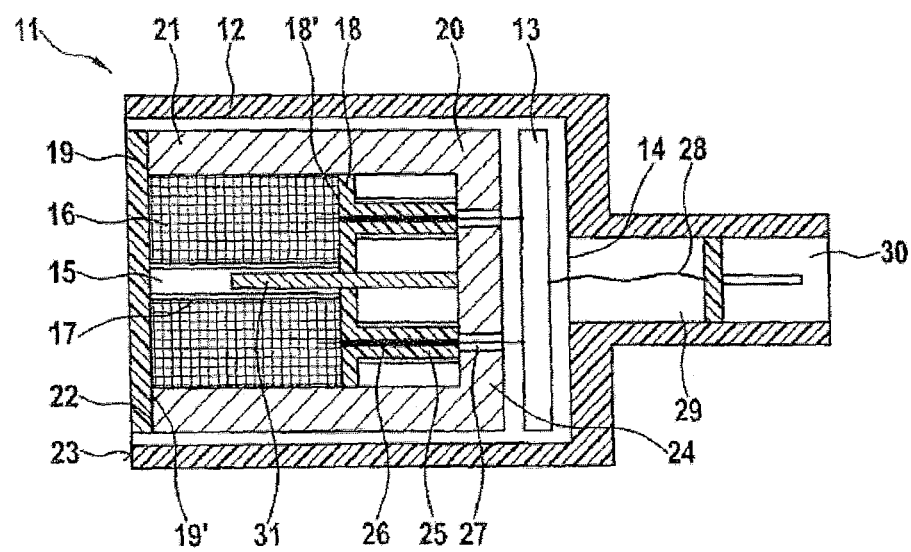

INDUCTIVE DISTANCE SENSOR

BACKGROUND

The invention relates to an inductive distance sensor.

One such distance sensor is known from DE 1 03 28 122 A1.

The core-fitted coil of an inductive distance sensor such as this is fed with a medium frequency from an oscillating circuit, which causes eddy-current losses in the ferromagnetic environment. This leads to the amplitude and phase of the feed frequency being influenced when the ferromagnetic mass changes as a result of moving toward or away from a ferromagnetic object, such as a wing of a door which is fitted locally with iron. A distance sensor such as this can therefore be used not only as a limit switch but also as a high-resolution distance measurement device. However, time-consuming inductive adjustment, which is susceptible to errors, is required for such use as a measurement system.

In order to restrict such adjustment, which is potentially subject to errors, and measurement errors caused in this way, provision is made essentially in the abovementioned prior publication for the inner wall diameter, which is larger than the core, of the winding support to taper resiliently at various circumferential positions on its internal casing surface, as a result of which the core which is introduced therebetween is always centered in the winding support, independently of its cylinder diameter.

However, fine adjustment is normally essential by linear or helical axial movement and final fixing of the core in the winding support. In this case, it is disadvantageous for series production that, in the case of a coil which is arranged in a ferromagnetic pot, the adjustment is achieved, despite the same coil characteristic data, only at axial positions of the core in its winding support which differ from one coil to another.

SUMMARY

Against the background of these circumstances, the present invention is based on the technical problem of reducing the adjustment effort and of allowing easier assembly for an inductive distance sensor of this generic type, in the interest of both higher measurement accuracy and a higher production rate.

According to an aspect of the invention, two flanges which are in the form of annular disks and are located at the ends of the tubular winding support have slightly different external diameters. The external diameter of the coil to be fitted to the winding support is thus restricted as a maximum to the external diameter of the smaller flange. This corresponds to the internal diameter of a pot, which is placed over the winding from the smaller flange, that is composed of ferromagnetic material and whose open end edge then rests against the inner surface of the larger flange, facing the coil. The geometrically precisely defined annular space between the flanges and between the winding support and the pot wall is therefore filled with the coil. Surprisingly, it has been found that, with this configuration, the axial position of the core in the winding support is in practice no longer critical, based on the spatial filling factor of the coil. It therefore now no longer needs to be screwed in, in a similar manner to a threaded bolt with an external thread, to a greater or lesser depth into the winding support of the coil former; according to the invention, it is sufficient for a core with a smooth outer casing surface to be held in the winding support. This is done most easily by the core being mounted or formed with one end at the center of the pot base, and thus being inserted into the interior of the tubular winding support when the pot is placed over the coil.

BRIEF DESCRIPTION OF THE DRAWINGS

FIG. 1 illustrates a cross-sectional view of an inductive distance sensor of an embodiment of the present invention.

Additional developments of and alternatives to the solution according to the invention are specified in the further claims and their advantages will become evident from the following description of one preferred exemplary embodiment of the invention, which is sketched in abstracted form, restricted to the essential functions, and not entirely to scale in the drawing. The single figure of the drawing uses an axial longitudinal section to show the design of an inductive eddy-current distance sensor designed according to the invention.

DETAILED DESCRIPTION OF EXEMPLARY EMBODIMENTS

As shown in FIG. 1, the sketched inductively operating distance sensor 11 has a printed circuit board 13, which is approximately in the form of a circular disk and has an electronic oscillating circuit 14, in a hollow-cylindrical surrounding housing 12, if required including a power supply and a measurement evaluation circuit. The oscillating circuit 14 feeds a coil 16, which is fitted axially in front of a coil former 15 composed of plastic, with a medium frequency (in the single-digit to two-digital kilohertz range). The coil 16 is wound onto a tubular winding support 17, whose two ends are equipped with flanges 18, 19 in the form of annular disks. The front (19) of these flanges has an external diameter which is the same as the internal diameter of the surrounding housing 12, and the rearward (18) of these flanges has an external diameter which is somewhat smaller than this. This results in a maximum winding volume which is predetermined by the design and is defined axially by the length of the winding support between its flanges 18-19, and radially by the external diameter of the rearward, smaller flange 18. The coil 16 always extends precisely between the mutually facing inner surfaces 18'-19' of the flanges 18, 19, and from the external diameter of the winding support 17 at most to the external diameter of the rearward flange 18.

The coil former 15 which has been fitted with the coil 16 in this way is accommodated in a pot 20 composed of ferromagnetic material. Its hollow-cylindrical wall 21 has an external diameter which is the same as the internal diameter of the surrounding housing 12, and it has an internal diameter which is at most slightly larger than the external diameter of the smaller flange 18. The pot 20 can therefore be placed axially from the rear over the coil former 15 which has been fitted with the coil 16, until the wall end edge 22 comes to rest axially against the outer annular area of the front, larger flange inner surface 19'. Since the external diameter of the front flange 19 has the same diameter as the pot wall 21, the coil former 15 together with the pot 20 can be closed at the front, on the measurement side, flush with the end 23 of the distance sensor surrounding housing 12.

In the interest of a greater mass, specifically because the pot 20 has a wall 21 which is axially longer than the winding support 17, its base 24 does not rest directly behind the rearward flange 18 against it, but can be kept at a distance from it by means of pillars 25 which are provided (integrally formed or fitted) at the rear to the smaller flange 18, parallel to the longitudinal axis of the surrounding housing 12. The pillars 25 are equipped with longitudinal channels 26 through which—and corresponding holes 27 in the pot base 24—wire ends or connecting wires of the coil 16 are passed to the printed circuit board 13. The latter is connected by means of a line routing 28 through a hollow connecting stub 29, which is narrower than the surrounding housing 12, to a connecting plug 30, which is accessible at the rear, for the operation of the circuits on the printed circuit board 13.

The precise axial position of a ferromagnetic core 31 in the winding support 17 has become non-critical because of the axially fixed and radially maximum predetermined volume of the coil 16 between the flanges 18-19 within the pot 20, and there is now generally no longer any need to adjust the position with respect to the distance between the core 31 and the plane of the measurement-side end 23 of the surrounding housing 12, and therefore for inductive calibration of the distance sensor 11. It has therefore become possible to place (to integrally form or to fit) the core 31 in front of the center of the pot base 24, in order at the same time to insert the core 31 coaxially into the winding support 17 in the course of axially placing the pot 20 over the populated coil former 15. The core 31 therefore no longer needs to be fixed therein separately in a force-fitting or interlocking manner.

Inductive adjustment of the core-fitted coil 16 of an eddy-current distance sensor 11 can thus be avoided if, according to the invention, the coil 16 fills a physically predetermined annular space between the winding support 17 of the plastic coil former 15 and its flanges 18-19 as well as the wall 21 of a pot 20 composed of ferromagnetic material, which is placed over the rearward, smaller flange 18 and whose end face 21 rests against an annular area of the front, larger flange 19 with the same diameter as the pot 20. The ferromagnetic coil core 31 which engages coaxially in the winding support 17 can therefore be arranged on the base 24 in the pot 20 and can therefore be mounted as part of the pot 20.

LIST OF REFERENCE SYMBOLS

11 Distance sensor
12 Surrounding housing (of 11)
13 Printed circuit board (in 12 behind 15-20)
14 Oscillating circuit (on 13)
15 Coil former (in 20-12)
16 Coil (on 17)
17 Winding support (of 15)
18 Small flange (of 17)
19 Large flange (of 17)
20 Pot (in 12 above 18 behind 19)
21 Wall (of 20)
22 End edge (of 21 behind 19)
23 End (of 12)
24 Base (of 20, behind 18)
25 Pillar (behind 18)
26 Longitudinal channels (through 25)
27 Holes (in 24, behind 26)
28 Line routing (from 13 through 29 to 30)
29 Hollow connecting stub (behind 12)
30 Connecting plug (for 11 at the rearward end of 29)
31 Core (in 17)

The invention claimed is:

1. An inductive distance sensor comprising:
a coil former comprising a tubular winding support extending longitudinally along an axis, a front annular flange provided at a front end face of the tubular winding support, and a rear annular flange provided at a rear end face of the tubular winding support;
a ferromagnetic core fitted with the tubular winding support;
a coil fitted with the tubular winding support between the front annular flange and the rear annular flange; and
a plurality of spacing pillars which are parallel to the axis and are provided behind the rear annular flange,
wherein the front annular flange has an external diameter which is larger than the external diameter of the rear annular flange,
wherein the coil former is arranged in a ferromagnetic pot, and the internal diameter of the ferromagnetic pot corresponds to the external diameter of the rear annular flange,
wherein the coil extends between an inner surface of the front annular flange and an inner surface of the rear annular flange, the inner surfaces facing each other, and
wherein the end wall edge of the ferromagnetic pot rests axially against an outer annular area of the front annular flange.

2. The distance sensor as claimed in claim 1, wherein the external diameter of the pot corresponds to the internal diameter of a surrounding housing.

3. The distance sensor as claimed in claim 1, wherein the annular space between the winding support and the pot wall is filled with the coil.

4. The distance sensor as claimed in claim 1, wherein the core is provided on a base of the pot and the core engages coaxially in the winding support.

5. The distance sensor as claimed in claim 1, wherein a base of the pot rests against the pillars.

6. The distance sensor as claimed in claim 1, further comprising a printed circuit board arranged behind a base of the pot.

7. The distance sensor as claimed in claim 6, wherein the coil is connected to the printed circuit board through longitudinal channels in the pillars and through holes in the pot base.

8. An inductive distance sensor comprising:
a coil former comprising a tubular winding support extending longitudinally along an axis, a front annular flange provided at a front end face of the tubular winding support, and a rear annular flange provided at a rear end face of the tubular winding support;
a ferromagnetic core fitted with the tubular winding support;
a coil fitted with the tubular winding support between the front annular flange and the rear annular flange; and
a plurality of spacing pillars being parallel to the axis and provided behind the rear annular flange,
wherein the front annular flange has an external diameter which is larger than the external diameter of the rear annular flange, and
wherein the coil former is arranged in a ferromagnetic pot, and the internal diameter of the ferromagnetic pot corresponds to the external diameter of the rear annular flange.

9. The distance sensor as claimed in claim 8, wherein the external diameter of the ferromagnetic pot corresponds to the external diameter of the front annular flange and to the internal diameter of a surrounding housing.

10. The distance sensor as claimed in claim 8, wherein the annular space between the tubular winding support and the ferromagnetic pot is filled with the coil.

11. The distance sensor as claimed in claim 8, wherein the core is provided on a base of the ferromagnetic pot and positioned coaxially in the tubular winding support.

12. The distance sensor as claimed in claim 11, wherein the base of the ferromagnetic pot rests against the spacing pillars, and the end wall of the ferromagnetic pot rests against an annular area of the front annular flange.

13. The distance sensor as claimed in claim 8, further comprising a printed circuit board arranged behind a base of the ferromagnetic pot.

14. The distance sensor as claimed in claim 13, wherein the coil is connected to the printed circuit board through longitudinal channels in the spacing pillars and through holes in the base of the ferromagnetic pot.

15. An inductive distance sensor comprising:
- a coil former comprising a tubular winding support extending longitudinally along an axis, a front annular flange provided at a front end face of the tubular winding support, and a rear annular flange provided at a rear end face of the tubular winding support;
- a ferromagnetic core fitted with the tubular winding support;
- a coil fitted with the tubular winding support between the front annular flange and the rear annular flange;
- wherein the front annular flange has an external diameter which is larger than the external diameter of the rear annular flange;
- wherein the coil former is arranged in a ferromagnetic pot, and the internal diameter of the ferromagnetic pot corresponds to the external diameter of the rear annular flange;
- a printed circuit board arranged behind a base of the ferromagnetic pot,
- further comprising a plurality of spacing pillars being parallel to the axis and provided behind the rear annular flange, wherein the base of the ferromagnetic pot rests against the spacing pillars and the end wall of the ferromagnetic pot rests against an annular area of the front annular flange.

16. The distance sensor as claimed in claim 15, wherein the external diameter of the ferromagnetic pot corresponds to the internal diameter of a surrounding housing.

17. The distance sensor as claimed in claim 15, wherein the annular space between the tubular winding support and the ferromagnetic pot is filled with the coil.

18. The distance sensor as claimed in claim 15, wherein the coil is connected to the printed circuit board through longitudinal channels in the spacing pillars and through holes in the base of the ferromagnetic pot.

* * * * *